United States Patent
Bhushan et al.

(10) Patent No.: US 7,176,695 B2
(45) Date of Patent: Feb. 13, 2007

(54) METHOD AND APPARATUS FOR MEASURING TRANSFER CHARACTERISTICS OF A SEMICONDUCTOR DEVICE

(75) Inventors: Manjul Bhushan, Hopewell Junction, NY (US); Mark B. Ketchen, Hadley, MA (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 11/477,305

(22) Filed: Jun. 29, 2006

(65) Prior Publication Data

US 2006/0273803 A1    Dec. 7, 2006

Related U.S. Application Data

(62) Division of application No. 10/930,097, filed on Aug. 31, 2004.

(51) Int. Cl.
    *G01R 27/28* (2006.01)

(52) U.S. Cl. .................. 324/615; 324/712; 324/713; 324/769

(58) Field of Classification Search .................. None
    See application file for complete search history.

(56) References Cited

U.S. PATENT DOCUMENTS

2004/0263199 A1* 12/2004 Braceras et al. ............ 324/768

OTHER PUBLICATIONS

Jenkins, et al., "Characteristics of SOI FET's Under Pulsed Conditions," IEEE Transactions on Electron Devices, 44 (11), Nov. 1997, 1923-1930.

* cited by examiner

Primary Examiner—Vincent Q. Nguyen
(74) Attorney, Agent, or Firm—Ido Tuchman; Ryan, Mason & Lewis, LLP (57) ABSTRACT

A method and apparatus is provided for measuring alternating current (AC) and direct current (DC) characteristics of a plurality of semiconductor devices. A ring oscillator generates pulses to drive the plurality of semiconductor devices under test. Current/Voltage (IV) and transfer characteristics of the plurality of semiconductor devices are measured using only DC input/output.

20 Claims, 7 Drawing Sheets

METHOD AND APPARATUS FOR MEASURING TRANSFER CHARACTERISTICS OF A SEMICONDUCTOR DEVICE

CROSS-REFERENCE TO RELATED APPLICATION(S)

This application is a divisional of pending U.S. application Ser. No. 10/930,097, filed on Aug. 31, 2004, the disclosure of which is incorporated by reference herein.

FIELD OF THE INVENTION

The present invention relates generally to semiconductor devices, and more particularly relates to the measurement of transfer characteristics of semiconductor devices.

BACKGROUND OF THE INVENTION

The direct current (DC) characteristics of metal oxide semiconductor field effect transistors (MOSFETs) are routinely used to project alternating current (AC) performance of complementary metal oxide semiconductor (CMOS) technology. A simple metric relates the high speed gate delay to the measured DC current of the field effect transistors (FETs) as delay, D~C*VDD/$I_d$, where C is the total switching capacitance, VDD is the power supply voltage and $I_d$ is a measure of the positive channel field effect transistor (PFET) and negative channel field effect transistor (NFET) DC currents. $I_d$ may be measured at gate and drain voltages equal to VDD ($I_{on}$), at any other gate or drain voltage or may be averaged over different points in the drain current/drain voltage (IDS-VDS) curves suitable for a certain gate type. This metric has proven very useful in bulk Si technologies.

In Silicon-On-Insulator (SOI) CMOS technology, the $I_d$ from DC measurements is intrinsically different from the equivalent $I_d$ under high speed switching conditions. This difference arises from 1) self-heating effect in the body of the FET, raising its temperature and hence reducing $I_d$ under static DC measurements and 2) floating-body-voltage which modulates the threshold voltage; $V_t$ and $I_d$ are different under DC and AC conditions. Measurement of FET currents with pulse inputs is made with specialized high frequency equipment, the complexity of which precludes it from being employed routinely in a manufacturing line. The current practice is to use the DC measured values with an estimated correction factor.

AC characteristics of MOSFETs are measured on the bench using high frequency probes and equipment. The measurements are time consuming and are not carried out routinely.

There is a need in the art for a method to directly measure both DC and AC (at frequencies in the GHz range) characteristics of the same MOSFETs using only DC inputs and outputs. There is a corresponding need in the art for a method to directly measure both AC and DC transfer characteristics of the same CMOS logic gates using only DC inputs and outputs.

SUMMARY OF THE INVENTION

The present invention discloses method and apparatus to measure AC and DC characteristics of a plurality of semiconductor devices, e.g., transistors. In one embodiment, a ring oscillator generates pulses to drive the plurality of transistors under test. Transfer characteristics of the plurality of transistors are measured using only DC inputs and outputs. In one embodiment, current/voltage (IV) characteristics (AC and DC), e.g. a subset of transfer characteristics, of the plurality of the transistors, are measured using only DC inputs and outputs.

One embodiment of the present invention discloses a continuous sequence of non-overlapping pulses being generated sequentially from a ring oscillator and applied to the gates of a set of m nominally identical NFETs under test, which are powered in parallel. The constant current drawn from the FET power supply is then the $I_d$ of a single FET under AC conditions (minimal self heating and steady state SOI floating body effect) for a given drain to source voltage and a given gate to source voltage. With the power supply to the ring oscillator turned off, the conventional DC characteristics of all FETs in parallel can be directly measured and compared to the AC results. Generating non-overlapping pulses and using these pulses to drive the gates of MOSFETs or inputs of other logic gates using only DC inputs and outputs allows for monitoring of AC characteristics in a manufacturing environment.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF PREFERRED EMBODIMENTS

Figure 1:
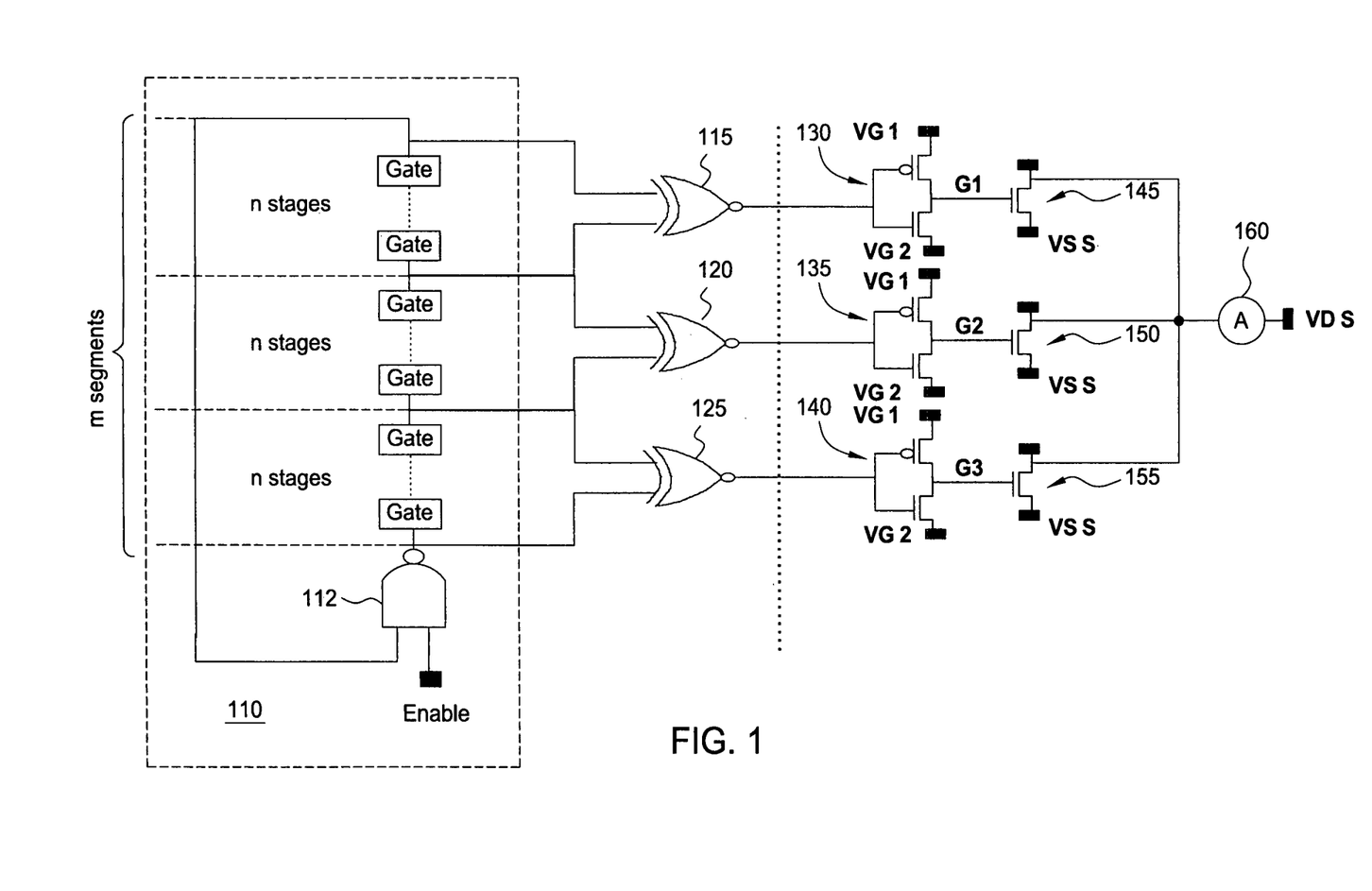
FIG. 1 illustrates one embodiment of the invention for the case of NFETs being the devices under test.

FIG. 1 illustrates one embodiment of the invention for the case of semiconductor devices, e.g., NFETs being the devices under test. The ring oscillator 110 comprises nm nominally identical stages and is divided up into m equal segments, each n stages in length, where n is an even number. The ring oscillator 110 also comprises a "not AND" (NAND) gate 112 which is used to start or shut off ring oscillator 110. The number of segments, which for simplicity has been set equal to three in FIG. 1, should typically be equal to or greater than ten. An exclusive nor (XNOR) 115,120,125 is connected across each segment of the ring oscillator 110. The ring oscillator 110 and XNORs 115,120, 125 share a common power supply (VDD) and a common ground. The output from each XNOR drives an inverter 130,135,140 powered by an independent power supply of amplitude VGS(=VG2−VG1). The output voltage of each such inverter 130,135,140 in turn drives the gate G1, G2, G3 of a FET 145,150,155 under test with its drain held at VDS and its source at VSS. The voltage supplied to the gates of the NFETs under test swings between VG2 and VG1. The m FETs 145,150,155 under test share common VDS and VSS supplies. A current measurement device 160 is used to measure the current IDS passing through the m FETs 145, 150, 155 under test.

Figure 2:
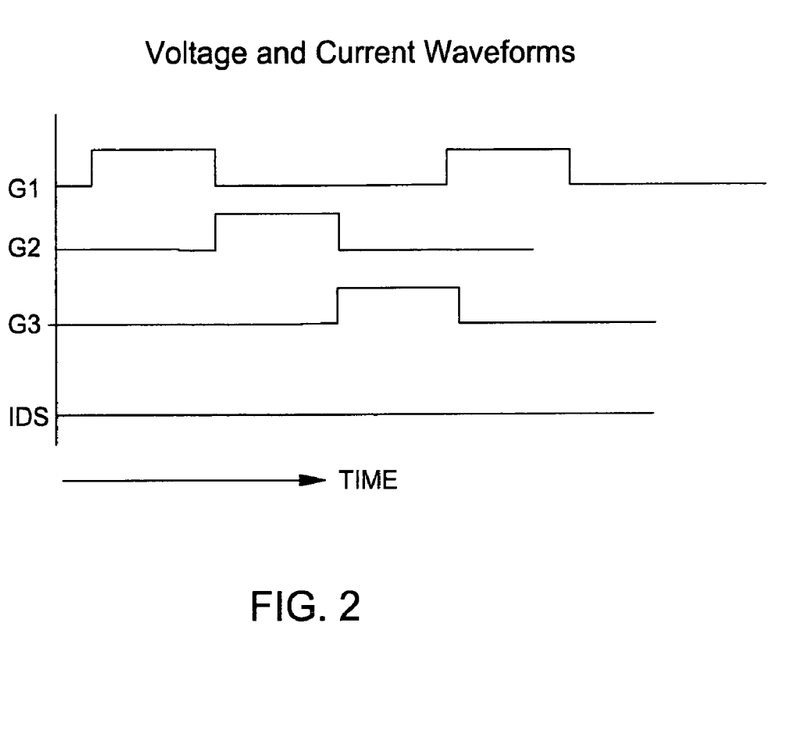
FIG. 2 illustrates a continuous sequence of non-overlapping pulses that are generated sequentially from the ring oscillator according to one embodiment.

FIG. 2 illustrates a continuous sequence of non-overlapping pulses that are generated sequentially from ring oscillator 110 and applied to the gates G1, G2, and G3 of a set of m (shown here as 3) nominally identical NFETs 145,150, 155 under test, which are powered in parallel. The pulse trains from all m segments of ring oscillator 110 are non-overlapping and configured such that at any given time one and only one pulse is present. The output from the XNOR 115,120,125 across each segment is a train of pulses of width T/m and period T, where T=mnt and t is the delay per stage of the ring. The constant current drawn from the FET power supply is then the $I_d$ of a single FET under AC conditions (minimal self heating and steady state SOI floating body effect) for a given drain to source voltage (VDS-VSS) and a given gate to source voltage (VG1-VSS). With the power supply to the ring oscillator turned off the conventional DC characteristics of all m FETs in parallel can be directly measured and compared to the AC results.

Calibration of the DC transfer curve for the m semiconductor devices in parallel is straightforward as this is a DC measurement that can be made very precisely with commercially available instrumentation. In one embodiment, the present invention enables one to measure the AC transfer curve in such a way that when the measured output is multiplied by m the ratio of the resulting transfer function to the DC transfer function for the m parallel devices is in fact the ratio of the AC to the DC transfer function. This is a consequence of the fact that in the AC measurement each of the m devices is on exactly 1/m of the time.

As a specific example, consider the case where VG1=VDD, VDS=VDD, and VSS and VG2=0(ground), T=10 ns, n=100, and m=10. In this case each FET is on and delivering $I_{on}$10% of the time and is off the remaining 90% of the time. The current drawn from the VDS supply is constant and equal to that of a single NFET under test. To the external DC current meter, this arrangement provides a constant current which can be measured accurately. This is illustrated in FIG. 1 for the case of m=3.

Since each NFET under test is only on 10% of the time the self heating, with a time constant of 100's of ns, is 1/10 that experienced by a similar device under conventional DC test conditions, and rendered insignificant. The NFET under test is in a steady state configuration delivering current 10% of the time, similar to the situation for a microprocessor clock buffer which fires every machine cycle. The repetition rate, in this example, of 100 MHz is 10× or more less than the frequency of modern microprocessors. However, from experimental measurements it has been determined that the delay of a PD SOI gate changes very little for repetition rates in the range of 100 MHz to 3 GHz. It follows that the floating body potential of the FETs under test will be very nearly that of similar devices in a high duty factor steady state operation in a microprocessor. The $I_{on}$ as measured as a DC current from the VDS supply is thus representative of the $I_{on}$ for similar devices in an operating microprocessor, with the appropriate body voltage and minimal self-heating.

A straightforward inline DC measurement can therefore give us the real $I_{on}$ of the device under high frequency operating conditions.

Under otherwise identical conditions, if the ring oscillator VDD is set to 0, then the output of the XNORs 115,120,125 will all be 0, and the outputs of all the intermediate inverters 130,135,140 applied to the gates of all the FETs under test will be VDD. The $I_{on}$ then measured as the DC current from the VDS supply is the standard $I_{on}$ for the 10 FETs in parallel as is conventionally measured in a DC inline test. This circuit thus allows one to directly measure and compare for the same devices the standard DC $I_{on}$ (with self-heating and DC body effect) with the $I_{on}$ under representative use conditions (minimal self-heating and steady state body effect). In the case of the AC measurements, the off current, $I_{off}$ should be subtracted from the measured $I_{on}$. The $I_{off}$ is measured by setting VGS=0 and VDS=VDD.

By virtue of the multiplicity of independent power supplies indicated in FIG. 1 it is possible to place VDS and VSS of the FETs under test arbitrarily with respect to the adjustable gate voltage swing between VGS1 and VGS2. This allows one to investigate the AC IV characteristics over a wide range of conditions.

Examples of other useful measurements that can be made are: 1) The external power supply VDS is varied to measure IDS vs. VDS at fixed VGS; 2) Ids vs. VGS is measured at a fixed VDS. Typically, the robust generation of pulses is limited to the range 0.5<VGS/VDD<1.5. The inverter preceding the NFETs is made up of low Vt FETs, to extend the range of VGS/VDD; 3) The VGS/VDD can be further extended by independently varying VG1 and VG2; 4) The source and drain terminals of the NFETs can be interchanged to study the asymmetric behavior; 5) The VDD of the ring oscillator and the temperature is varied to measure the transistor characteristics under different conditions; and 6) The pulse width and the period T can be varied by using current starved inverters as the ring stages which allows one to vary the delay per stage (t) by as much as 10× or more.

An embodiment of the present invention is illustrated in FIGS. 3, 4, 5, and 6. Both NFETs and PFETs with m=10 are shown.

Figure 3:
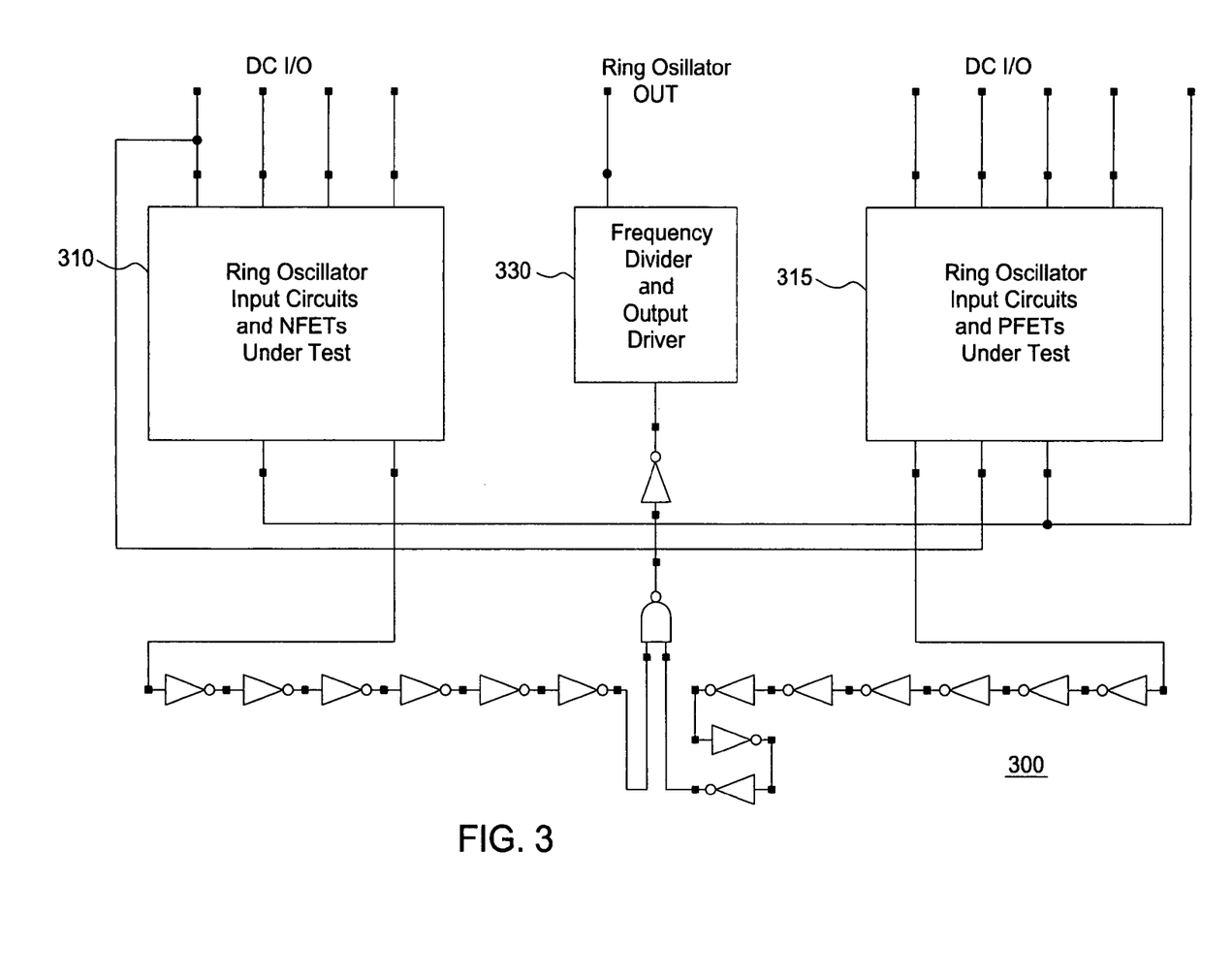
FIG. 3 illustrates a top level circuit diagram of the invention according to one embodiment.

FIG. 3 shows a top level circuit diagram 300 according to one embodiment of the invention. A device 310 comprising a 1000 stage ring oscillator, input circuits, and NFETS is on the left. Another similar device 315 comprises another ring oscillator, input circuits, and PFETS on the right. Only one ring is operating at a time and its output goes to the centrally located frequency divider 330 and then to an output driver 330 for monitoring purposes.

Figure 4:
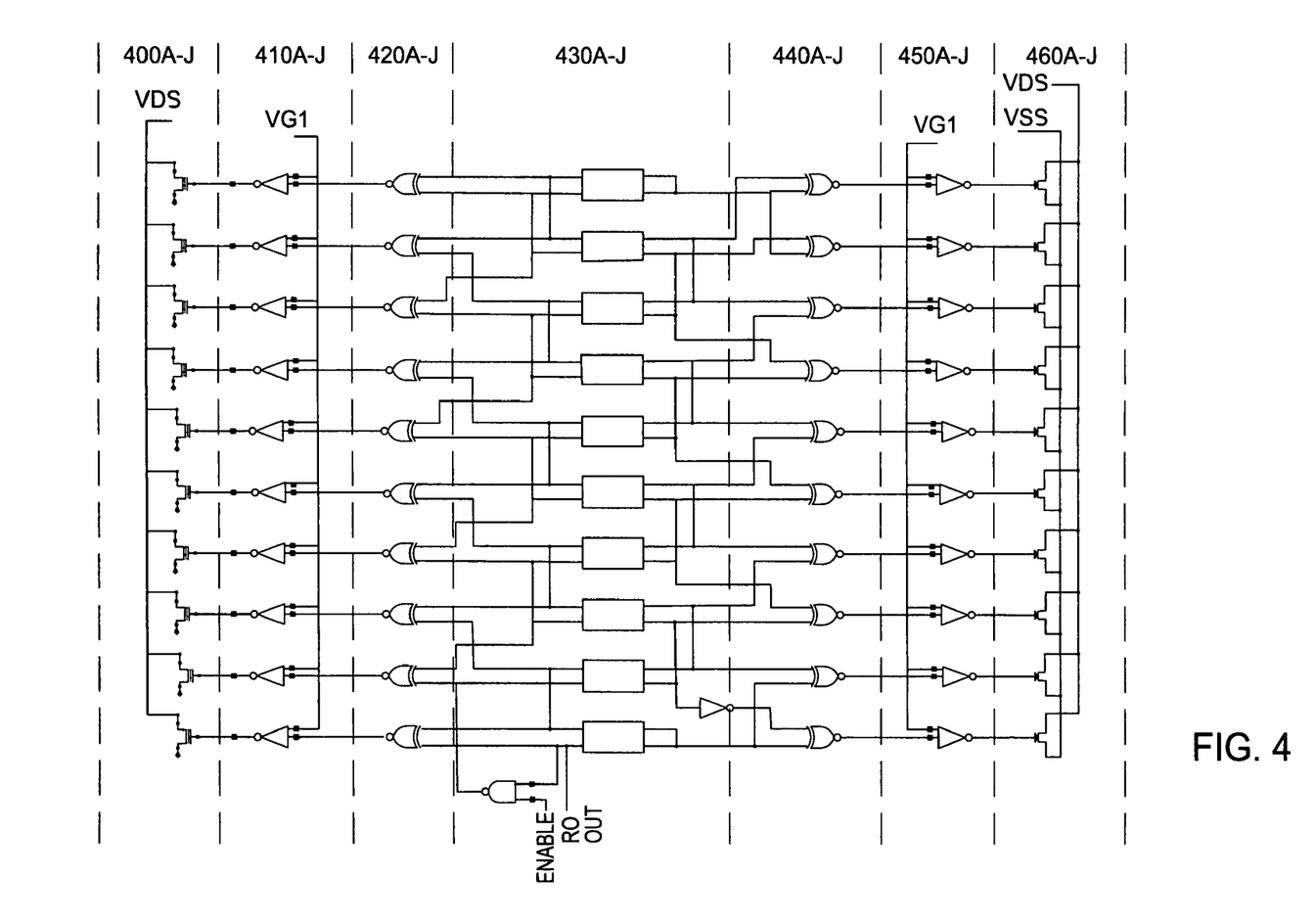
FIG. 4 illustrates one embodiment of the invention that is used to test NFETs.
Figure 6:
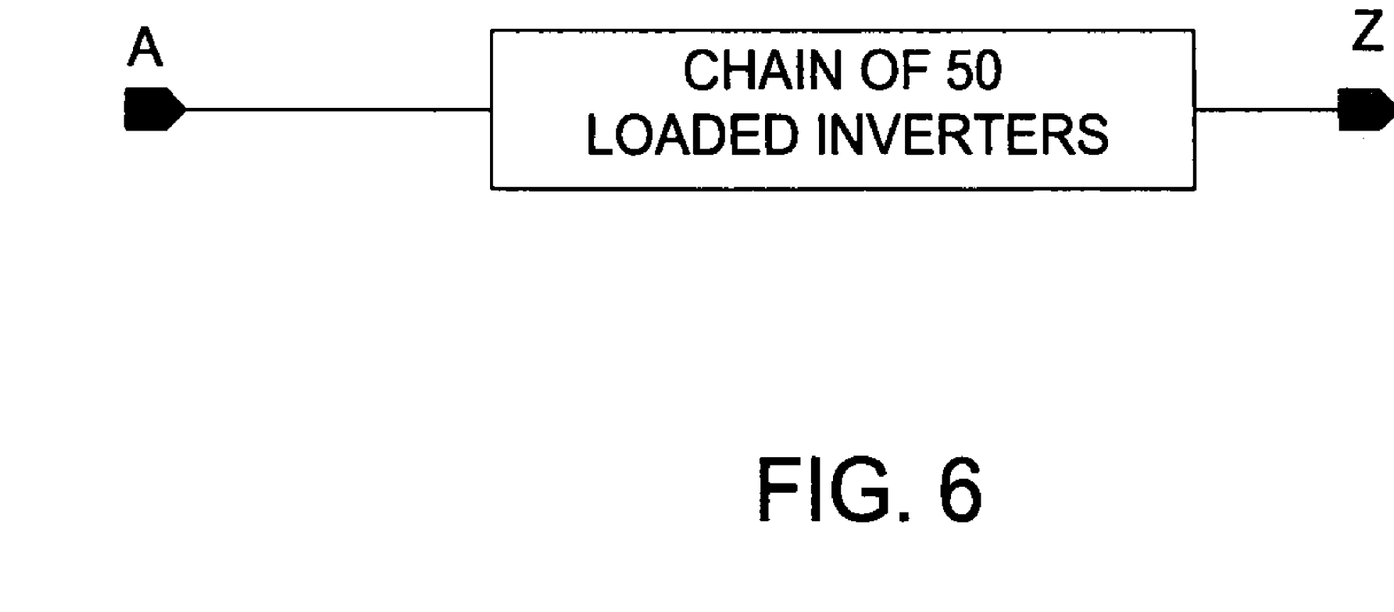
FIG. 6 illustrates one embodiment of a section of the ring oscillators of FIGS. 4 and 5.

FIG. 4 illustrates one embodiment of the device 310 that is used to test NFETs. Two different sets of 10 NFETs 400A–J, 460A–J are serviced by the ring 430A–J with its enabling NAND. VG2 is always tied to the ring oscillator ground. Each box in ring 430A–J comprises a set of 50 right going and 50 left going loaded inverters. FIG. 6 shows the right going case. The right side NFETs 460A–J under test have both VSS and VDS adjustable. The left side NFETs 400A–J under test have VSS at the ring oscillator ground, while VDS remains adjustable.

Figure 5:
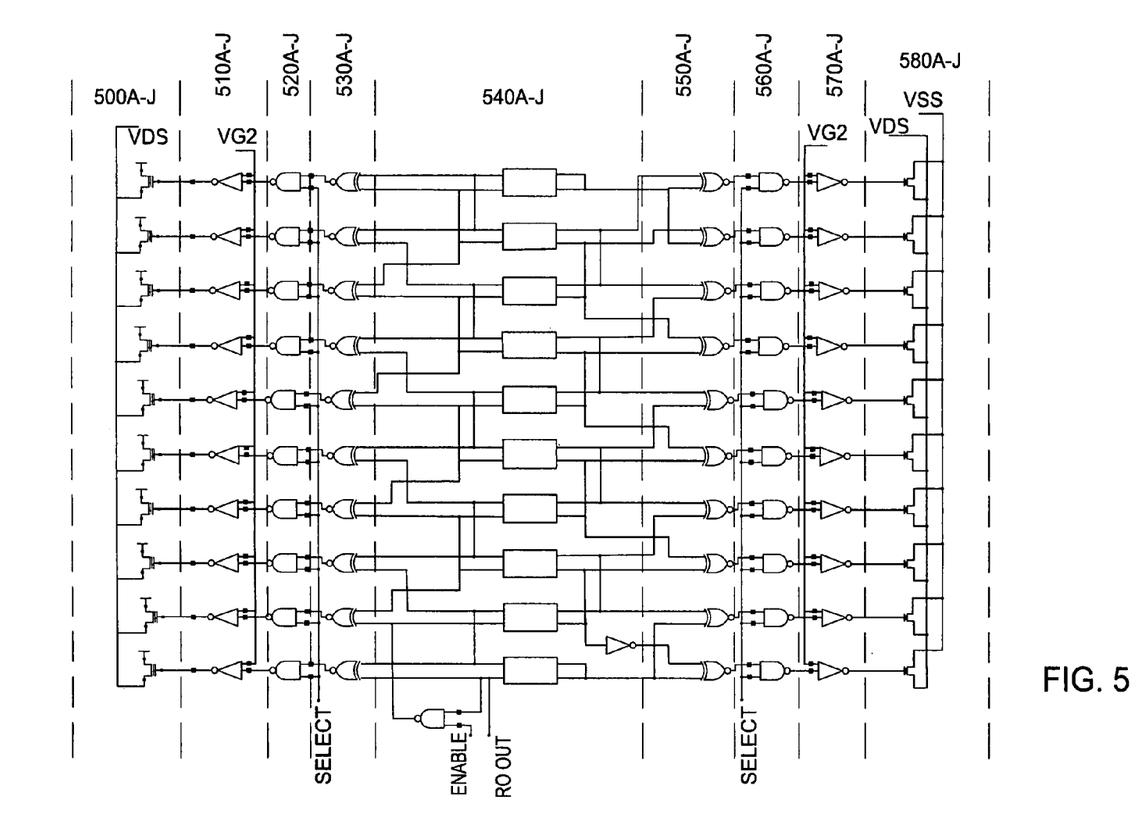
FIG. 5 illustrates one embodiment of the invention that is used to test PFETs.

FIG. 5 illustrates one embodiment of the device 315 in FIG. 3 that is used to test PFETs. Two different sets of 10 PFETs 500A–J, 580A–J are serviced by each ring 540A–J and VG1 is always tied to the ring oscillator VDD. Each box in ring 430A–J comprises a set of 50 right going and 50 left going loaded inverters as shown in FIG. 6. For each ring 540A–J the left side PFETs 500A–J under test also have VSS at the ring oscillator VDD. Additional NAND2 gates 520A–J and 560A–J (sharing VDD and ground with the ring oscillator) with an independent SELECT input are positioned as shown. With the ring running and the NAND SELECT at VDD this additional inversion stage ensures pulses of the appropriate polarity are delivered to the PFET gates. When the select is switched to ground, the DC voltage VG2 is applied to the gates of all the PFETs under test and the DC IDS of all ten PFETs in parallel can be measured.

A similar configuration to those shown in FIGS. 4 and 5 can be used to measure the AC voltage transfer characteristics of a semiconductor device, i.e. voltage out as a function of voltage in. This can be accomplished in at least two different ways. In one embodiment, the VGS pulse is applied to the input of the semiconductor device and the output is fed to the gate of an NFET. The output voltage is read in terms of the NFET current which is calibrated independently from IDS-VGS plots under both AC and DC conditions. In another embodiment, a large resistor followed by a capacitor (low pass filter) is added in series with the output and the average output voltage is read directly with a high impedance voltmeter as the voltage across the capacitor. With a plurality of different supply voltages as shown in FIG. 1 it is possible to obtain the AC and DC voltage transfer values at any arbitrary point on the transfer curve, analogous to the way Id can be measured for transistors.

Figure 7:
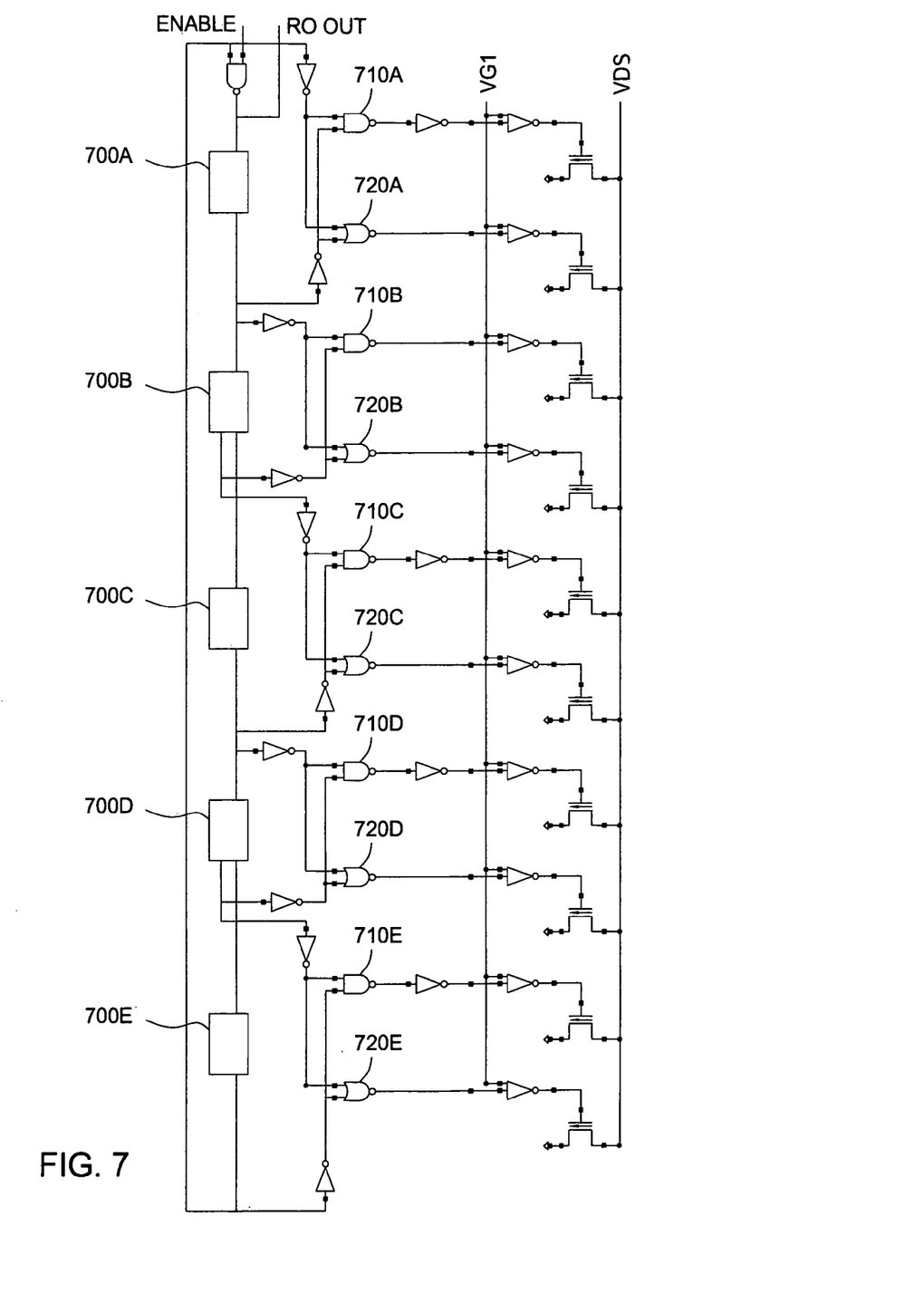
FIG. 7 illustrates an alternative embodiment for generating pulses to apply to the gates of FETs under test.

An alternative embodiment for generating the pulses is shown in FIG. 7 for the case of NFETs under test. In the embodiment described in FIG. 7, n for each sector is an odd number and a combination of "not AND"/"not OR" (NAND/NOR) 720–729 gates is used in place of an XNOR. In this embodiment, each device 700A–E comprises a segment of inverters with the signal traveling downward. The configuration shown again repetitively generates ten sequential non-overlapping pulses, five via the NANDs 710A–E and five via the NORs 720A–E. The advantage of this scheme is that the number of stages in the ring oscillator 700A–E can be reduced to half. On the other hand it requires more careful tuning of device widths and parasitics in the NAND/NOR logic to ensure that there are no gaps between the pulses.

Although the present invention is disclosed above with transistors, the present invention is not so limited. Namely, the present invention can be adapted for use with any semiconductor devices under test.

While the foregoing is directed to embodiments of the present invention, other and further embodiments of the invention may be devised without departing from the basic scope thereof, and the scope thereof is determined by the claims that follow.

What is claimed is:

1. An apparatus for testing a plurality of semiconductor devices, comprising:
   means for sequentially generating a continuous sequence of non-overlapping pulses, each of the non-overlapping pulses being applied for 1/M of the time, where M equals a number of nominally identical semiconductor devices;
   means for using the pulses to drive the plurality of semiconductor devices; and
   means for measuring transfer characteristics of the plurality of semiconductor devices using only direct current inputs and direct current outputs.

2. An apparatus, comprising:
   a plurality of semiconductor devices under test; and
   a ring oscillator for sequentially generating a continuous sequence of non-overlapping pulses to drive the plurality of semiconductor devices in order to measure transfer characteristics of the plurality of semiconductor devices using only direct current inputs and direct current outputs, the ring oscillator comprising m equal segments, where m represents a number of nominally identical semiconductor devices.

3. The apparatus of claim 2, further comprising a plurality of exclusive NOR gates (XNORs), where each XNOR is connected across one of the m segments.

4. The apparatus of claim 3, further comprising a plurality of inverters, each inverter being driven by one of the plurality of XNORs.

5. The apparatus of claim 4, wherein the plurality of inverters is utilized to drive the plurality of semiconductor devices under test.

6. The apparatus of claim 2, further comprising a plurality of "not AND" gates (NANDs) and "not OR" gates (NORs), wherein each NAND or NOR is connected across one of the m segments.

7. The apparatus of claim 6, further comprising a plurality of inverters, each inverter being driven by one of the plurality of NANDs or NORs.

8. The apparatus of claim 7, wherein the plurality of inverters are utilized to drive the plurality of semiconductor devices under test.

9. The apparatus of claim 2, wherein the ring oscillator comprises stages comprising current starved inverters that allow a frequency of the ring oscillator to be varied.

10. The apparatus of claim 2, wherein the apparatus is configured for obtaining alternating current characteristics of the plurality of semiconductor devices.

11. The apparatus of claim 10, wherein pulses for measuring the alternating current transfer characteristics are generated by alternating an on/off status of an input for each of the plurality of semiconductor devices such that at any given time a constant amplitude input pulse is applied to only one of the plurality of semiconductor devices.

12. The apparatus of claim 2, wherein the apparatus is configured for obtaining direct current characteristics of the plurality of semiconductor devices.

13. The apparatus of claim 2, wherein the plurality of semiconductor devices comprise n-channel field effect transistors (NFETs), p-channel field effect transistors (PFETs), or both.

14. The apparatus of claim 2, wherein the transfer characteristics of the plurality of semiconductor devices are measured by providing a direct comparison of alternating current and direct current transfer characteristics for said plurality of semiconductor devices.

15. The apparatus of claim 2, wherein the transfer characteristics of the plurality of semiconductor devices are measured by obtaining direct current transfer characteristics by measuring a constant amplitude output from the plurality of semiconductor devices in response to a constant amplitude input to the plurality of semiconductor devices.

16. The apparatus of claim 15, wherein the pulses for measuring alternating current transfer characteristics are obtained by alternating an on/off status of the constant amplitude input for each of the plurality of semiconductor devices such that at any given time the constant amplitude input pulse is applied to only one of the plurality of semiconductor devices.

17. The apparatus of claim 16, wherein a time required to alternate the on/off status of the constant amplitude input to each of the semiconductor devices is negligible compared to a width in time of the input pulses.

18. The apparatus of claim 2, wherein a frequency of the ring oscillator is adjustable.

19. An apparatus, comprising:
a plurality of semiconductor devices under test; and a ring oscillator for sequentially generating a continuous sequence of non-overlapping pulses to drive the plurality of semiconductor devices in order to measure transfer characteristics of the plurality of semiconductor devices using only direct current inputs and direct current outputs, the ring oscillator comprising M equal segments, wherein M equals number of nominally identical semiconductor devices, wherein a pulse is generated across each of the segments as a circulating ring signal passes through each segment.

20. An apparatus, comprising:
a plurality of semiconductor devices under test; and
a ring oscillator for sequentially generating a continuous sequence of non-overlapping pulses to drive the plurality of semiconductor devices in order to measure transfer characteristics of the plurality of semiconductor devices using only direct current inputs and direct current outputs; said ring oscillator comprising M equal segments, wherein M equals number of nominally identical semiconductor devices;

wherein an output from an alternating current transfer curve measurement comprises a direct current quantity comprised of a sum of outputs from the plurality of semiconductor devices, each of said plurality of semiconductor devices being driven by its respective pulsed input.

* * * * *